United States Patent
Middlebrooks et al.

(10) Patent No.: US 11,143,970 B2
(45) Date of Patent: *Oct. 12, 2021

(54) METHOD AND APPARATUS FOR IMAGE ANALYSIS

(71) Applicant: ASML Netherlands B.V., Veldhoven (NL)

(72) Inventors: Scott Anderson Middlebrooks, Duizel (NL); Markus Gerardus Martinus Maria Van Kraaij, Eindhoven (NL); Adrianus Cornelis Matheus Koopman, Hilversum (NL); Stefan Hunsche, Santa Clara, CA (US); Willem Marie Julia Marcel Coene, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/943,296

(22) Filed: Jul. 30, 2020

(65) Prior Publication Data
US 2020/0356009 A1 Nov. 12, 2020

Related U.S. Application Data

(60) Continuation of application No. 16/561,096, filed on Sep. 5, 2019, now Pat. No. 10,732,513, which is a (Continued)

(51) Int. Cl.
*G03B 27/32* (2006.01)
*G03F 7/20* (2006.01)
(Continued)

(52) U.S. Cl.
CPC ............ *G03F 7/705* (2013.01); *G03F 7/7065* (2013.01); *G03F 7/70625* (2013.01);
(Continued)

(58) Field of Classification Search
CPC .. G03F 7/705; G03F 7/70625; G03F 7/70633; G03F 7/7065; G06T 2207/10061;
(Continued)

(56) References Cited

U.S. PATENT DOCUMENTS

| 7,250,237 B2 | 7/2007 | Ottens et al. |
| 7,875,851 B1 | 1/2011 | Haidinyak et al. |

(Continued)

FOREIGN PATENT DOCUMENTS

| DE | 196 14 896 | 10/1997 |
| WO | 2010/037472 | 4/2010 |

OTHER PUBLICATIONS

International Search Report and Written Opinion dated Mar. 2, 2016 in corresponding International Patent Application No. PCT/EP2015/076582.

(Continued)

*Primary Examiner* — Peter B Kim
(74) *Attorney, Agent, or Firm* — Pillsbury Winthrop Shaw Pittman LLP

(57) ABSTRACT

A method and apparatus of detection, registration and quantification of an image is described. The method may include obtaining an image of a lithographically created structure, and applying a level set method to an object, representing the structure, of the image to create a mathematical representation of the structure. The method may include obtaining a first dataset representative of a reference image object of a structure at a nominal condition of a parameter, and obtaining second dataset representative of a template image object of the structure at a non-nominal condition of the parameter. The method may further include obtaining a deformation field representative of changes between the first dataset and the second dataset. The deformation field may be generated by transforming the second dataset to project the
(Continued)

template image object onto the reference image object. A dependence relationship between the deformation field and change in the parameter may be obtained.

23 Claims, 8 Drawing Sheets

Related U.S. Application Data division of application No. 15/533,309, filed as application No. PCT/EP2015/076540 on Nov. 13, 2015, now Pat. No. 10,437,157.

(60) Provisional application No. 62/089,692, filed on Dec. 9, 2014.

(51) Int. Cl.
*G06T 7/12* (2017.01)
*G06T 7/149* (2017.01)
*G06T 7/60* (2017.01)

(52) U.S. Cl.
CPC ............ *G03F 7/70633* (2013.01); *G06T 7/12* (2017.01); *G06T 7/149* (2017.01); *G06T 7/60* (2013.01); *G06T 2207/10061* (2013.01); *G06T 2207/20161* (2013.01); *G06T 2207/30148* (2013.01)

(58) Field of Classification Search
CPC . G06T 2207/20161; G06T 2207/30148; G06T 7/12; G06T 7/149; G06T 7/60
See application file for complete search history.

(56) References Cited

U.S. PATENT DOCUMENTS

| | | | |
|---|---|---|---|
| 8,331,651 B2 | 12/2012 | Nishiura et al. | |
| 8,768,022 B2 | 7/2014 | Miga et al. | |
| 9,563,131 B2 | 2/2017 | Quintanilha | |
| 9,704,810 B2 | 7/2017 | Den Boef | |
| 9,811,006 B2 | 11/2017 | Wildenberg et al. | |
| 9,965,578 B2 | 5/2018 | Akhssay | |
| 10,146,140 B2 | 12/2018 | Pisarenco et al. | |
| 10,295,913 B2 | 5/2019 | Middlebrooks et al. | |
| 10,437,157 B2 | 10/2019 | Middlebrooks et al. | |
| 10,732,513 B2 * | 8/2020 | Middlebrooks ..... G03F 7/70625 | |
| 2004/0202369 A1 * | 10/2004 | Paragios ................... G06T 7/11 382/173 | |
| 2005/0136346 A1 | 6/2005 | Ottens et al. | |
| 2006/0008179 A1 | 1/2006 | Fischer et al. | |
| 2006/0132749 A1 | 6/2006 | Bruls et al. | |
| 2009/0202139 A1 | 8/2009 | Toyoda et al. | |
| 2010/0001203 A1 | 1/2010 | Nakayama et al. | |
| 2010/0074516 A1 | 3/2010 | Kawaragi | |
| 2010/0135568 A1 | 6/2010 | Preil et al. | |
| 2011/0234226 A1 | 9/2011 | Nitta et al. | |
| 2011/0286658 A1 | 11/2011 | Mitsui | |
| 2012/0002861 A1 | 1/2012 | Nishiura et al. | |
| 2012/0154774 A1 | 6/2012 | Van Der Wijst et al. | |
| 2012/0156810 A1 | 6/2012 | Fukazawa | |
| 2012/0249779 A1 | 10/2012 | Ji et al. | |
| 2012/0327386 A1 | 12/2012 | Huang et al. | |
| 2013/0015350 A1 | 1/2013 | Chen et al. | |
| 2013/0059240 A1 | 3/2013 | Van Der Schaar et al. | |
| 2013/0162963 A1 | 6/2013 | Spruit et al. | |
| 2013/0183611 A1 | 7/2013 | Finders | |
| 2013/0217154 A1 | 8/2013 | Fukazawa et al. | |
| 2014/0125695 A1 | 5/2014 | Lodron et al. | |
| 2014/0254904 A1 | 9/2014 | Matthews | |
| 2014/0291513 A1 | 10/2014 | Gabrani et al. | |
| 2014/0340663 A1 | 11/2014 | Scaccabarozzi et al. | |
| 2014/0368800 A1 | 12/2014 | Koevoets et al. | |
| 2015/0002547 A1 | 1/2015 | Itai | |
| 2015/0070666 A1 | 3/2015 | Jacobs et al. | |
| 2015/0142397 A1 | 5/2015 | Pond | |
| 2015/0168852 A1 | 6/2015 | Beerens et al. | |
| 2015/0205213 A1 | 7/2015 | Cekli et al. | |
| 2015/0286887 A1 | 10/2015 | Dave et al. | |
| 2015/0331336 A1 | 11/2015 | Quintanilha et al. | |
| 2016/0334713 A1 | 11/2016 | Slotboom et al. | |
| 2017/0064219 A1 | 3/2017 | Lin et al. | |
| 2017/0068171 A1 | 3/2017 | Moest et al. | |
| 2017/0078706 A1 | 3/2017 | Van Der Vleuten et al. | |
| 2017/0212429 A1 | 7/2017 | Koevoets et al. | |
| 2017/0212431 A1 | 7/2017 | Van De Wal et al. | |
| 2017/0345138 A1 | 11/2017 | Middlebrooks et al. | |
| 2018/0095369 A1 | 4/2018 | Van De Ruit et al. | |
| 2018/0196363 A1 | 7/2018 | Bijnen et al. | |
| 2018/0246419 A1 | 8/2018 | Liu | |
| 2018/0348654 A1 | 12/2018 | Bijnen | |
| 2019/0281234 A1 | 9/2019 | Lin et al. | |

OTHER PUBLICATIONS

International Search Report and Written Opinion dated Mar. 2, 2016 in corresponding International Patent Application No. PCT/EP2015/076540.
Kass, Michael et al., "Snakes: Active contour models", International Journal of Computer Vision, vol. 1, pp. 321-331 (1988).
Osher, Stanley et al., "Fronts propagating with curvature-dependent speed: Algorithms based on Hamilton-Jacobi formulation", Journal of Computational Physics vol. 79, No. 1, pp. 12-49 (1988).
Fischer, Bernd et al., "A unified approach to fast image registration and a new curvature based registration technique", Linear Algebra and its Applications, vol. 380, pp. 107-124 (2004).
Tolani, Vikram et al., "Lithographic plane review (LPR) for sub-32nm mask defect disposition", Proceedings of SPIE, vol. 7823, pp. 1-13 (2010).
Chan, Tony F. et al., "Active Contours Without Edges", IEEE Transactions on Image Processing, vol. 10, No. 2, pp. 266-277 (2001).
Legrain, Gregory et al., "An X-FEM and Level Set computational approach for image-based modeling. Application to homogenization", International Journal for Numerical Methods in Engineering, vol. 86, No. 7, pp. 915-934 (2010).
Pang, Linyong et al., "Optimization from Design Rules, Source and Mask, to Full Chip with a Single Computational Lithography Framework: Level-Set-Methods based Inverse Lithography Technology (ILT)", Proceedings of SPIE—Optical Microlithography XXIII, vol. 7640, pp. 76400O-1-76400O-21 (2010).
Park, Jin-Hyung et al., "Mask Pattern Recovery by Level Set Method based Inverse Inspection Technology (IIT) and its Application on Defect Auto Disposition", Proceedings of SPIE, vol. 7488, pp. 748809-1-748809-11 (2009).
Weisbuch, François, "Extending critical dimension measurement for optical microlithography with robust SEM image contours", Proceedings of SPIE, vol. 9530, pp. 953003-1-953003-10 (Jun. 2015).
Zhu, Guopu et al., "Boundary-based image segmentation using binary level set method", Optical Engineering, vol. 46, No. 5, pp. 050501-1-050501-3 (2007).
Notice of Allowance issued in corresponding U.S. Appl. No. 15/533,614, dated Nov. 18, 2019.

* cited by examiner

METHOD AND APPARATUS FOR IMAGE ANALYSIS

This application is a continuation of U.S. patent application Ser. No. 16/561,096, which was filed on Sep. 5, 2019, now allowed, which is a divisional of U.S. patent application Ser. No. 15/533,309, which was filed on Jun. 5, 2017, now U.S. Pat. No. 10,437,157, which is the U.S. national phase entry of PCT patent application no. PCT/EP2015/076540, which was filed on Nov. 13, 2015, which claims the benefit of priority of U.S. provisional application No. 62/089,692, which was filed on Dec. 9, 2014, each of the foregoing applications is incorporated herein in its entirety by reference.

FIELD

The present description relates to methods and apparatus for detection, registration and high-resolution quantification of images.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable to frequently make measurements of the structures created, e.g., for process control and verification. One or more parameters of the structures are typically measured or determined, for example the critical dimension of a structure, the overlay error between successive layers formed in or on the substrate, etc. There are various techniques for making measurements of the microscopic structures formed in a lithographic process. Various tools for making such measurements are known including, but not limited to, scanning electron microscopes (SEMs), which are often used to measure critical dimension (CD). SEMs have high resolving power and are capable of resolving features of the order of 50 nm, 10 nm or less.

SUMMARY

The information contained in SEM images of device structures can be used for defect detection or classification, yield estimation and/or process control or monitoring. Such SEM images may processed to extract contours that describe the edges of objects, representing device structures, in the image. These contours are then quantified via metrics, such as CD. Thus, typically, the images of device structures are compared and quantified via simplistic metrics, such as an edge-to-edge distance (CD) or simple pixel differences between images.

Typical contour models that detect the edges of the objects in an image in order to measure CD use image gradients. Indeed, those models rely on strong image gradients. But, in practice, the image typically is noisy and has discontinuous boundaries. Techniques, such as smoothing, adaptive thresholding, edge-detection, erosion, and dilation, may be used to process the results of the image gradient contour models to address noisy and discontinuous images, but will ultimately result in a low-resolution quantification of a high-resolution image. Thus, in most instances, mathematical manipulation of images of device structures to reduce noise and automate edge detection results in loss of resolution of the image, thereby resulting in loss of information. Consequently, the result is a low-resolution quantification that amounts to a simplistic representation of a complicated, high-resolution structure.

It is therefore desirable to have a mathematical representation of the imaged device structures that can preserve the resolution and yet describe the general shape of the device structures. So, it is desirable, for example, to provide methods and apparatus for computational detection of objects, representing device structures, in an image measured by a measuring apparatus such as a SEM. It is also desirable to provide methods and apparatus for a high resolution representation of images of device structures obtained through a lithographic process. Furthermore, although not limited to this, it would be of advantage if the methods and apparatus could be applied to analyzing high resolution structure images for process control and/or monitoring.

In an aspect, there is provided a method of detection and representation of an object, representing a device structure, in an image measured by an imaging apparatus such as a SEM. The method may include obtaining an image of a lithographically created structure; and applying a level set method to an object, representing the structure, of the image to create a mathematical representation of the structure.

In an aspect, there is provided a method of detection and representation of an object, representing a device structure, in an image measured by an imaging apparatus such as a SEM. The method may comprising defining a curve enclosing an object, representing a lithographically created structure, of an image; evolving the curve subject to constraints of the object; terminating evolution of the curve when an area enclosed by the curve reaches the boundary of the object; and obtaining a numerical function upon termination of the evolution of the curve. In some embodiments, the method may further include binarizing the numerical function to obtain a dataset representing the object.

In an aspect, there is provided a method of registration of a template image object representing a structure to a reference image object representing the structure. The method may include obtaining a first dataset representing a reference image object of the structure, wherein the structure of the reference image object is obtained at a nominal condition. The method further includes obtaining a second dataset representing a template image object of the structure, wherein the structure of the template image object is obtained at a non-nominal condition. The method further includes obtaining a deformation field by transforming the second dataset to project the template image object onto the reference image object.

In an aspect, there is provided a method of detection, registration and quantification of an image. The method includes obtaining a first dataset representative of a reference image object of a structure, the structure for the reference image object being obtained at a nominal condition of a parameter, and obtaining a second dataset representative of a template image object of the structure, the structure for the template image object being obtained at a non-nominal condition of the parameter. The method further includes obtaining a deformation field representative of changes between the first dataset and the second dataset. The deformation field is generated by transforming the second dataset to project the template image object onto the reference image object. A dependence relationship between the deformation field and the parameter may be obtained by varying the parameter to obtain a plurality of deformation fields corresponding to a plurality of non-nominal conditions of the parameter. The dependence relationship may then be generated by evaluating change in the deformation fields to the plurality of non-nominal conditions of the parameter.

In an aspect, there is provided a method of manufacturing devices wherein a device pattern is applied to a series of substrates using a lithographic process, the method including evaluating a lithographic structure imaged using the lithographic process using a method described herein and controlling the lithographic process for one or more of the substrates in accordance with the result of the method. In an embodiment, the lithographic structure is imaged on at least one of the substrates and comprising controlling the lithographic process for later substrates in accordance with the result of the method.

In aspect, there is provided a non-transitory computer program product comprising machine-readable instructions configured to cause a processor to cause performance of a method described herein.

In an aspect, there is provided a system of detection, registration and quantification of images of a structure of a device. The system includes a scanning electron microscope configured to provide an image of a lithographically created structure; and an image analysis engine comprising the non-transitory computer program product as described herein. In an embodiment, the system further comprises a lithographic apparatus comprising a support structure configured to hold a patterning device to modulate a radiation beam and a projection optical system arranged to project the modulated onto a radiation-sensitive substrate.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
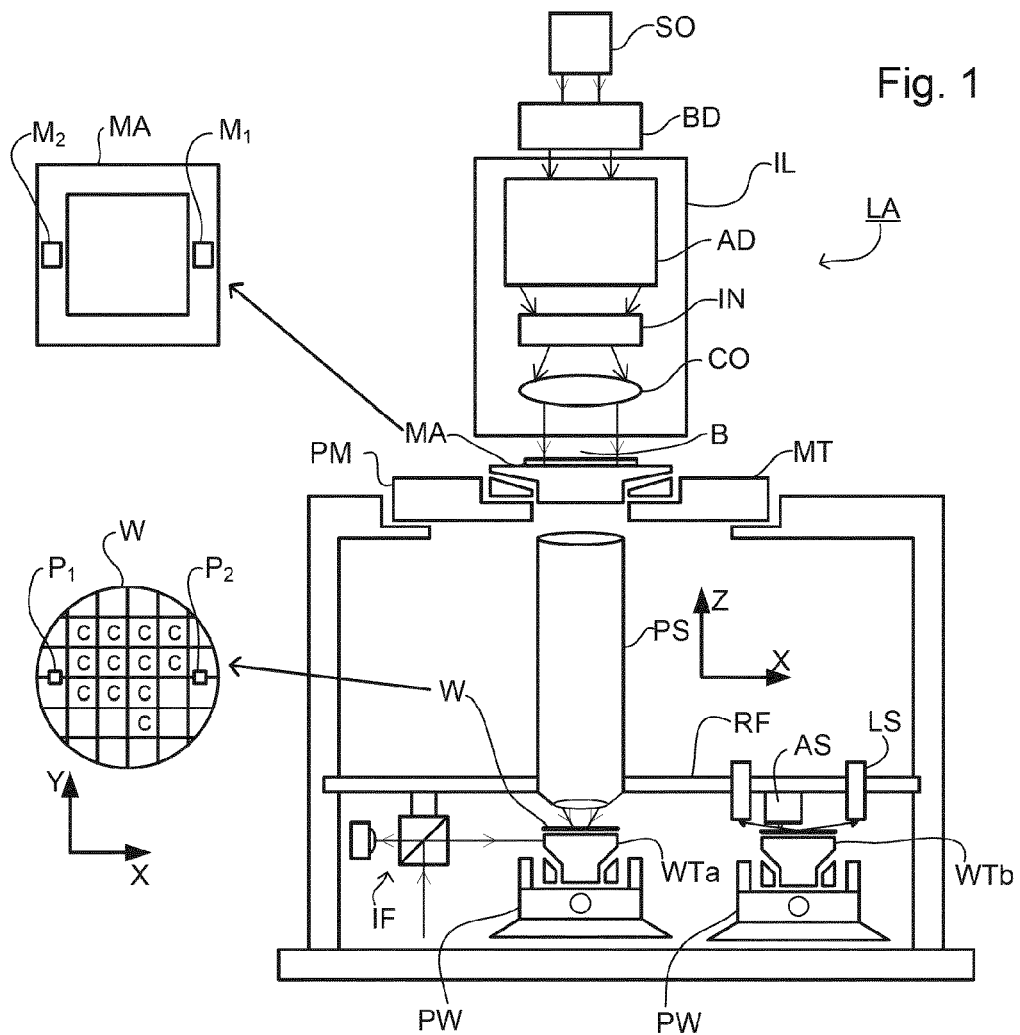
FIG. 1 schematically depicts an embodiment of a lithographic apparatus.

FIG. 1 schematically depicts a lithographic apparatus LA. The apparatus comprises:
- an illumination system (illuminator) IL configured to condition a radiation beam B (e.g. DUV radiation or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
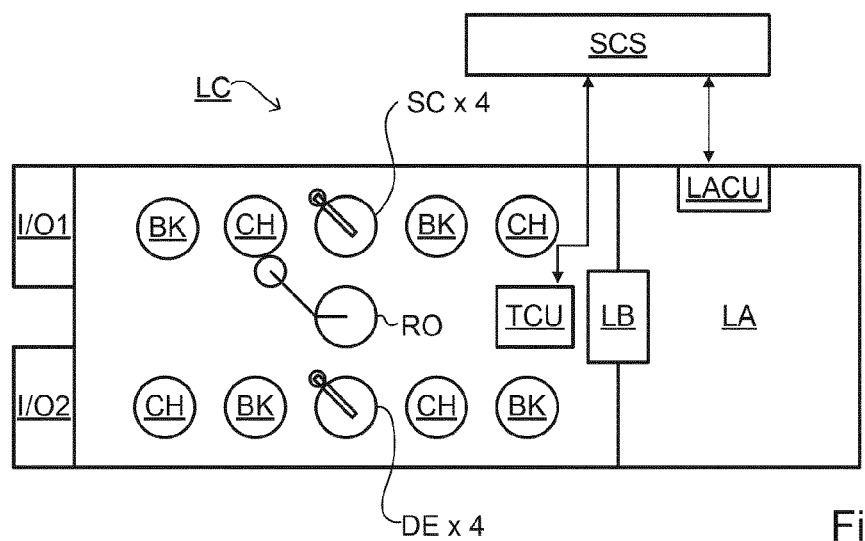
FIG. 2 schematically depicts an embodiment of a lithographic cell or cluster.

As shown in FIG. 2, the lithographic apparatus LA may form part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates. This may particularly useful, for example, if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

Figure 3:
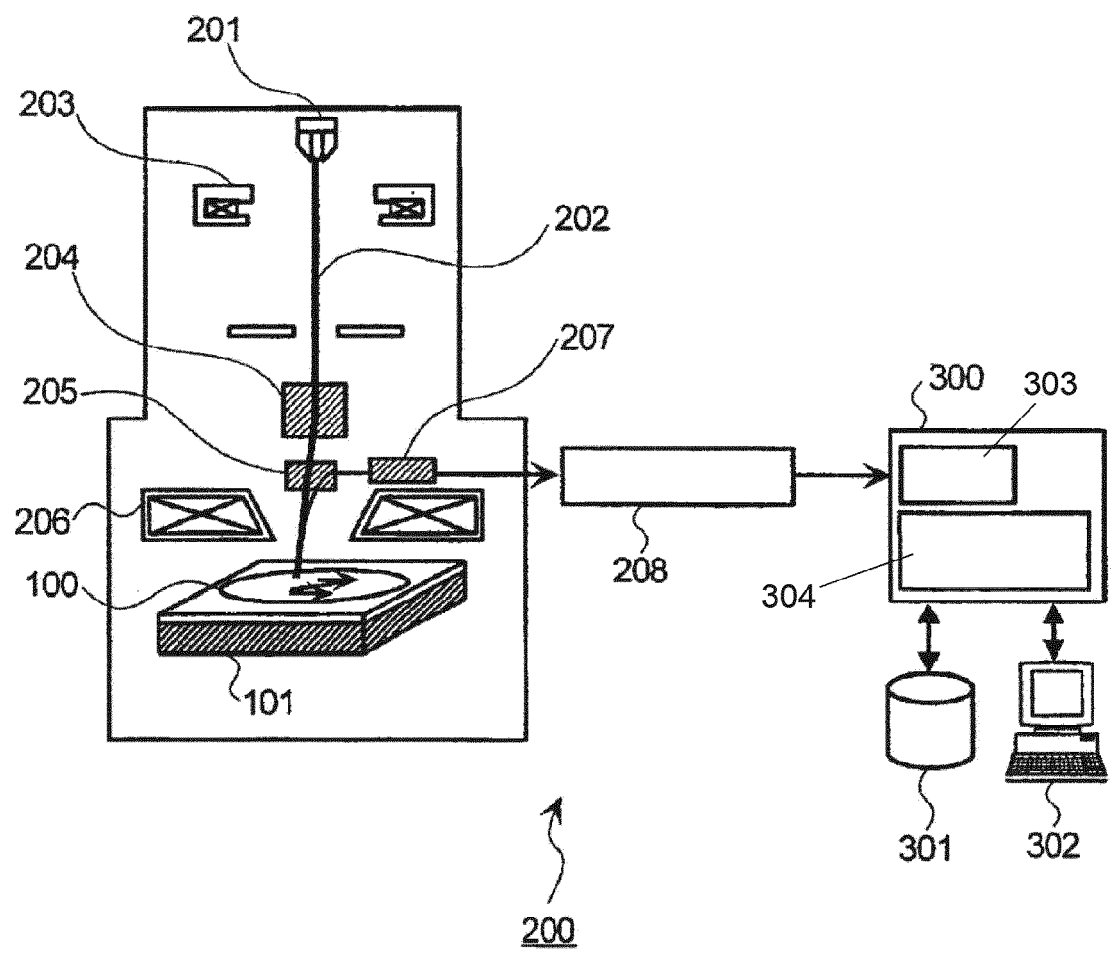
FIG. 3 schematically depicts an embodiment of a scanning electron microscope (SEM)

In some embodiments, the inspection apparatus may be a scanning electron microscope (SEM) that yields an image of one or more structures (e.g., some or all the structures of a device) exposed or transferred on the substrate. FIG. 3 depicts an embodiment of a SEM 200. A primary electron beam 202 emitted from an electron source 201 is converged by condenser lens 203 and then passes through a beam deflector 204, an E×B deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the E×B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction.

A signal detected by secondary electron detector 207 is converted to a digital signal by an analog/digital (ND) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software) is configured to convert or process the digital images into datasets representative of the digital images. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

As noted above, it is desirable to have a mathematical representation of the images of device structures (e.g., circuit features, alignment mark or metrology target portions (e.g., grating features), etc.), whether, e.g., the structures are in a latent resist image, in a developed resist image or transferred to a layer on the substrate, e.g., by etching, that can preserve the resolution and yet describe the general shape of the device structures. In the context of lithography, the structure may be a device or a portion thereof that is being manufactured and the images may be SEM images of the structure. In some instances, the structure may be a feature of semiconductor device, e.g., integrated circuit. In some instances, the structure may be an alignment mark, or a portion thereof (e.g., a grating of the alignment mark), that is used in an alignment measurement process to determine alignment of an object (e.g., a substrate) with another object (e.g., a patterning device) or a metrology target, or a portion thereof (e.g., a grating of the metrology target), that is used to measure a parameter (e.g., overlay, focus, dose, etc.) of the lithographic process. In an embodiment, the metrology target is a diffractive grating used to measure, e.g., overlay.

Accordingly, there is provided, for example, methods and apparatus for computational detection of objects, representing device structures, in an image measured by a measuring apparatus such as a CD-SEM. Further, there is provided, for example, methods and apparatus for mathematical representation/quantification of images of device structures obtained through a lithographic process, which representation/quantification is able to preserve the high resolution of the images and describe any general shape, which may include interior contours. Further, there is provided, for example, methods and apparatus to provide a rich multivariate signal/representation that quantifies the differences in the complicated shape of a structure of a device, as imaged by a SEM, which signal/representation can be used for defect detection, process control, etc. Furthermore, there is provided, for example, methods and apparatus of analyzing high resolution structure images for process control and/or monitoring. Further, given the large number of structures on a typical substrate in a lithographic process, there is provided, for example, automated detection of objects (representing the structures) in an image measured by a SEM.

Accordingly, in an embodiment, a process for detection of objects, representing device structures, in an image measured by a SEM is described. Numerical techniques such as active contour models, snakes, level set methods, curve evolution, etc. may be used for analysis of datasets representing the digital images measured by the SEM. The process results in a mathematical representation of objects in an image that allows high-resolution holistic detection of objects.

Figure 4:
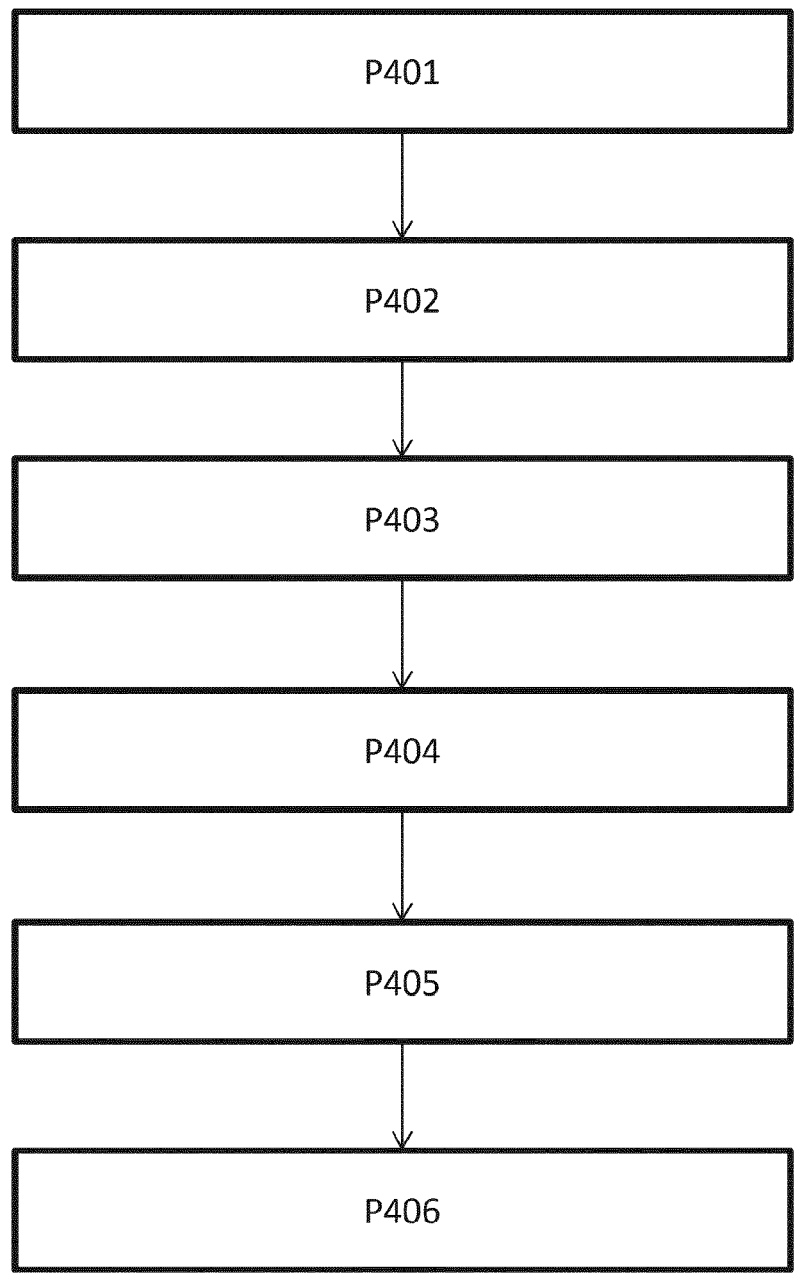
FIG. 4 schematically depicts a process of detecting and representing objects in an image.

In an embodiment, as depicted in FIG. 4, a method of detecting and representing objects in an image is described. The method may include, at P401 obtaining, from an imaging apparatus (e.g., a SEM such as a CD-SEM), an image that includes an object representing one or more device structures, at P402 defining a curve enclosing the object, at P403 evolving the curve subject to constraints of a given image, at P404 terminating evolution of the curve when an area enclosed by the curve reaches the boundary of the object; at P405 obtaining a numerical function upon termination of the evolution of the curve; and at P406 binarizing the numerical function to obtain a dataset representing the object.

Thus, the method of detection of an object in an image is to evolve a curve, subject to constraints for a given image, say $u_0$, in order detect the objects in the image (i.e., an active contour or snake model). For example, an arbitrary curve can be chosen around the object to be detected, and moved towards its interior at a direction normal to the curve. The curve stops on the boundary of the object. A particular stopping term or function is used to stop the curve at the boundary.

In a 2D space, let $\Omega$ be a bounded open subset of $\mathbb{R}^2$, with $\partial \Omega$ its boundary. Let $u_0$: $\overline{\Omega} \to \mathbb{R}$ be a given image, and C(s): $[0, 1] \to \mathbb{R}^2$ be a parameterized curve.

In some embodiments, the evolution of the curve C of the model is stopped at the boundary of the object by an edge-detector that depends on the gradient of the image. That is the model defines the smoothness of the contour (the internal energy) and the attraction of the contour toward the object in the image (the external energy). So, by minimizing the energy, the curve at the object boundary is located at the points of maxima, which act as an edge-detector, while keeping a smoothness in the curve at the object boundary. The method is described in detail in Kass, et al., "Snakes: Active contour models,"*Int. J. Comput. Vis.*, vol. 1 pp 321-331 (1988).

In some embodiments, a level set method is used. The level set method is a method which represents the boundary between regions in an image implicitly by the set of points for which a function, known as the level set function, defined on the image, takes on a fixed value. This may be the zero level set. Furthermore the method may comprise a differential equation describing the evolution over time of the level set function. The level set method may be used as an iterative technique to minimize an energy functional, such that an image is segmented optimally into a number of regions. For instance, an image may segmented into two regions, a method for which includes identifying a curve which divides the image into two regions, and where the position and shape of the curve or surface may correspond to a position and shape which minimizes an energy functional representing the error corresponding to a sum of the difference between the values of each of the data points in each of the two regions and an average of the values within each region respectively. The level set method is in general a procedure for evolving curves according to a differential equation. The 'driving force' of the evolution of the curve can either be inherent to properties of the contour itself (e.g. local curvature), but may advantageously be tied to local image properties.

For example, as described in more detail by Osher and Sethian, "Fronts propagating with curvature-dependent speed: Algorithms based on Hamilton-Jacobi formulation," *J Comput Phys.*, vol. 79, pp. 12-49 (1988), the curve C may be represented implicitly via a Lipschitz function ϕ, by C={(x, y)|ϕ(x, y)=0}, and the evolution of the curve is given by a zero-level curve at time t of the function ϕ(t, x, y). Evolving the curve C in the normal direction with speed F results in solving the differential equation:

$$\frac{\partial \phi}{\partial t} = |\nabla \phi| F, \phi(0, x, y) = \phi_0(x, y)$$

where the set {(x, y)|ϕ₀(x, y)=0} defines the initial contour.

So, in an embodiment, a level set method is used to detect an object in an image, such as a SEM image. That is, an energy functional is minimized. Minimizing this functional is done via variational calculus techniques. In particular, the object boundary is detected by solving Euler-Lagrange equations for the functional. After solving the Euler-Lagrange equations, a binary description is provided of the object of the imaged device.

In an embodiment, a variational formulation is utilized to help circumvent direct references to edges, enabling identification of 'fuzzy' boundaries. So, in an embodiment, the level set method comprises a level set implementation of Mumford-Shah segmentation. This embodiment may adaptively segment an image into two regions with different average image intensity, such as values of parameters, such that the values within each region are (optimally) homogenous in the sense of varying closely around the respective averages. Mumford-Shah segmentation may thus include minimization of heterogeneity.

Segmenting an image into two regions with different average image intensity, such as values of parameters, such that the values within each region are (optimally) homogenous in the sense of varying closely around the respective averages may be related to minimization of a cost function (or energy), embodied by the sum of intensity homogeneity in the two regions, over all possible contours. This is effectively a variational calculus problem, and an effective iterative solution can be formulated by recasting the problem in terms of a level set function, and calculating the associated Euler-Lagrange equation. In an embodiment, the level set method comprises an implementation of a Chan-Vese model. The Chan-Vese Model may be seen as a simplification of the level set implementation of a Mumford-Shah model, where a piecewise-constant function is estimated.

The Chan-Vese model is described in T. F. Chan and L. A. Vese, "Active contours without edges," *IEEE Trans. Img. Proc.*, vol. 10, no. 2, pp. 266-277 (2001), which is incorporated herein in its entirety by reference. So, the evolving curve C, in Ω, defines the boundary of an open subset ω of Ω (i.e. C=∂ω). In this model, an energy functional is minimized as the curve C moves toward the desired object. The energy functional F(c₁, c₂, C) is defined by the equation:

$$F(c_1,c_2,C)=\mu \cdot \text{Length }(C)+v \cdot \text{Area }(\text{inside}(C))+\lambda_1 \int_{\text{inside}(C)}|u_0(x,y)-c_1|dxdy+\lambda_2\int_{\text{outside }(C)}\|u_0(x,y)-c_2|^2dxdy, \quad \text{(Equation 1)}$$

where inside(C) denotes the region inside the curve C (ω), outside (C) denotes the region outside the curve C (Ω\ω̄), μ≥0, v≥0, λ₁, λ₂>0 are fixed parameters, and the constants c₁ and c₂, depending on C, are the averages of inside C and outside C respectively. The object is detected by solving the Euler-Lagrange equations for the functional defined by Equation 1. In order to compute the Euler-Lagrange equation, the evolving curve C may be represented by a zero level set of a Lipschitz function ϕ: Ω→ℝ, such that $$C=\partial\omega=\{(x,y)\varepsilon\Omega{:}\phi(x,y)=0\}.$$

$$\text{inside}(C)=\omega=\{(x,y)\varepsilon\Omega{:}\phi(x,y)>0\}$$

$$\text{outside}(C)=\Omega\backslash\bar\omega=\{(x,y)\in\Omega{:}\phi(x,y)<0\}.$$

The Euler-Lagrange equation is defined by:

$$\frac{\partial \phi}{\partial t} = \delta_\varepsilon(\phi)\left[\mu div\left(\frac{\nabla \phi}{|\nabla \phi|}\right) - v - \lambda_1(u_0 - c_1)^2 + \lambda_2(u_0 - c_2)^2\right] = 0 \text{ in } (0, \infty)\times\Omega, \quad \text{(Equation 2)}$$

$$\phi(0, x, y) = \phi_0(x, y) \text{ in } \Omega,$$

$$\frac{\delta_\varepsilon((t))}{|\nabla(t)|}\frac{\partial \phi}{\partial \vec{n}} = 0 \text{ on } \partial\Omega$$

where $\lambda_1, \lambda_2, v, c_1$ and $c_2$ are fixed parameters, $\vec{n}$ denotes the exterior normal to the boundary ∂Ω, $$\frac{\partial \phi}{\partial \vec{n}}$$

denotes the normal derivative of ϕ at the boundary, and $\delta_\varepsilon = H_\varepsilon'$ where $H_\varepsilon$, is any $C^2(\overline{\Omega})$ regularization of the Heaviside function H.

The ϕ, e.g., ϕ₀(x, y) resulting from, e.g., solving Equation 2 represents the detected object. In an embodiment, the detected object is binarized by applying filtering rules to ϕ₀(x, y):

$$\phi_0(x,y)>0; \phi=1;$$

$$\phi_0(x,y)<0; \phi=0$$

Such a binarized object may, advantageously, reduce the computational load when analyzing a large number of objects.

Figure 5A:
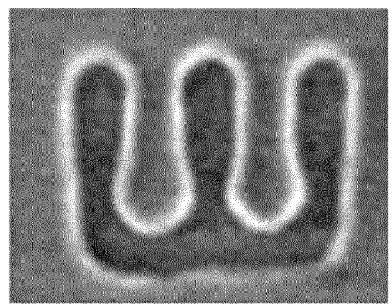
FIGS. 5A-5H depict SEM images, and visualizations of their mathematical representation, of a structure of a device obtained at a nominal condition and non-nominal condition, respectively.
Figure 5B:
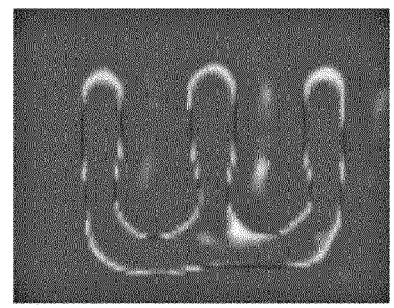
Figure 5C:
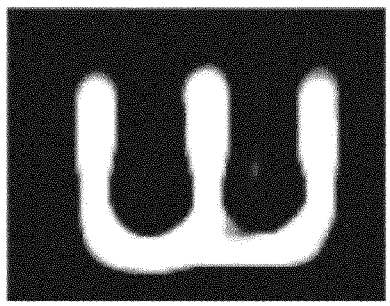
Figure 5D:
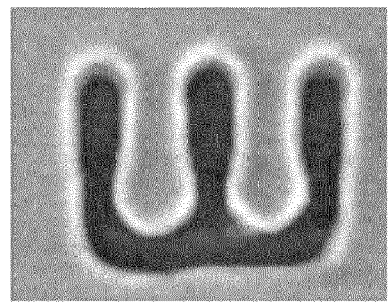
Figure 5E:
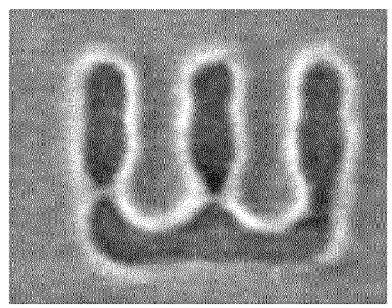
Figure 5F:
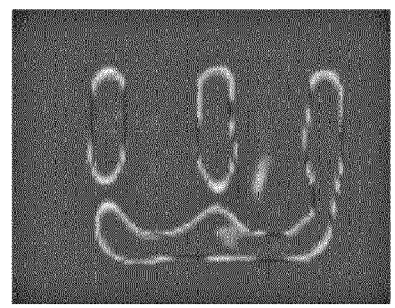
Figure 5G:
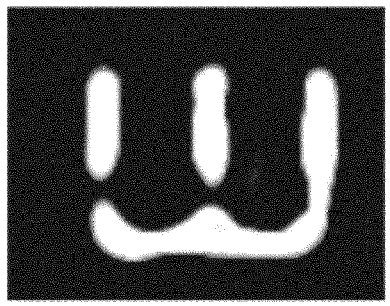
Figure 5H:
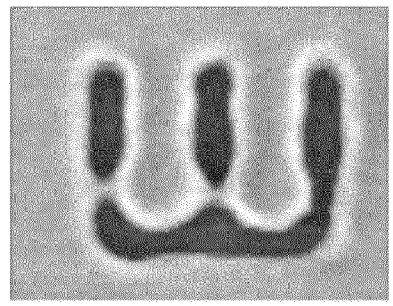

FIGS. 5A-5D depict SEM images and mathematical representations of a structure of a device produced at a nominal condition of a parameter used to form the structure and FIGS. 5E-5H depict SEM images and mathematical representations of the same structure produced at a non-nominal condition of the parameter, e.g., at focus offset. FIGS. 5A and 5E represent the structure of the device as measured by the SEM, FIGS. 5B and 5F represent a visualization of the computed ϕ, FIGS. 5C and 5G represent a visualization of the binarized ϕ, and FIGS. 5D and 5H represent a visualization of the overlay of the measured device (FIGS. 5A and 5E) and the (inverse) binarized representation of the device, i.e., binarized ϕ (FIGS. 5C and 5G). It can be seen in the binary object representations of the structure in FIGS. 5C, 5D, 5G and 5H preserve the image resolution. For example, it can be seen that the nooks and crannies of the structure are resolved in the mathematical representations.

Thus, this method allows a full mathematical representation of the structure as imaged by, e.g., a SEM. For example, the mathematical representation (e.g., ϕ) may include 3-dimensional information, whether measured data from the $3^{rd}$ dimension or data derived for the $3^{rd}$ dimension from the nature of two dimensional data.

Thus, the method can accurately detect an object in a noisy image and the resulting mathematical description of the imaged structure is rich with high-resolution information, which can be utilized for defect detection, model identification, process monitoring, etc. Moreover, using such a mathematical representation, a quantification of how the structure changes as a function of one or more parameters, such as focus, dose, etc., can be evaluated. Further, with such a mathematical representation of a particular structure, an image comprising a plurality of structures can be evaluated (using an appropriate threshold to account for differences) to identify one or more instances of the particular structure in the image.

Figure 6:
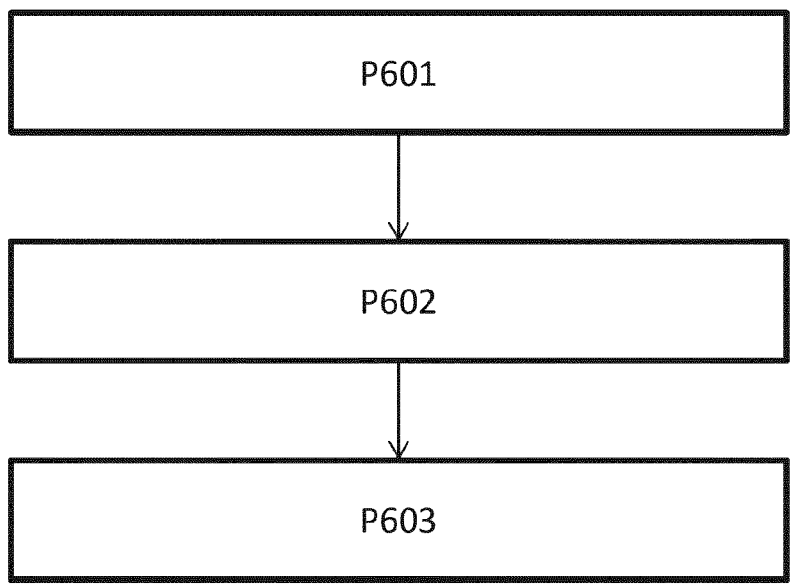
FIG. 6 schematically depicts a process for registration of a template image object to a reference image object.

In an embodiment, as depicted in FIG. 6, a method of registration of a template image object representing a structure (e.g., an object representing a measured structure for consideration) to a reference image object representing the same structure (e.g., an object representing a measured or ideal structure for comparison) is described. The method may include at P601 obtaining a first dataset representing a first image of the structure, wherein the image is of the structure at a nominal condition of a parameter for forming the structure. This first dataset may be considered as representing a reference image object of the structure. The first dataset may be obtained by a measurement of the structure or may be an ideal image of the structure. At P602 a second dataset representing a second image of the structure, wherein the image is of the structure at a non-nominal condition of the parameter. The non-nominal condition may differ from a nominal condition by more than one parameter. This second dataset may be considered as representing a template image object of the structure. At P603 a deformation field is computed by transforming the second dataset to project the template image object onto the reference image object. This deformation field is representative of the difference between the first dataset and the second dataset.

The one or more parameters may include one or more process parameters that may be varied during the lithography process. The one or more parameters may include, but are not limited to, focus, exposure dose, numerical aperture, a film stack material property, a film stack geometric dimension, lens aberration, coherence, and/or illumination spatial/angular intensity distribution.

In general, when manufacturing integrated circuits, various parameters of the lithography process need to be optimized to repeatably obtain the desired device or a feature thereof within acceptable tolerances. When optimizing or otherwise configuring a process, one or more parameters are, typically, iteratively varied and resulting device structures obtained at a non-nominal condition are compared with a standard obtained at a nominal condition. For example, a metrology or alignment mark may be compared before and after a process step, and so may be measured to provide a reference image object (i.e., of the structure obtained at a nominal condition) and a template image object (i.e., the structure obtained at a non-nominal condition) respectively. Comparison between the reference image object and the template image object may provide important clues with regard to how a process may be changed by, for example, varying one or more parameters. In some instances, comparison between the reference image object and the template image object may provide a method of quality control by detecting a defect in the manufactured structure.

In an embodiment, the image objects may be represented by datasets obtained by computationally detecting the structures as described herein. For example, the binarized $\phi$ for a nominal condition may form the first dataset and the binarized $\phi$ for a non-nominal condition may form the second dataset. While the Chan-Vese model has been described herein as an example of computational object detection, the embodiments described herein are not limited to the Chan-Vese model. As such, any suitable computational model for computational object detection may be used for obtaining a numerical representation of the image objects representing one or more structures of a device.

Once the first and the second datasets are obtained, a deformation field is generated by transforming the second dataset to project the second (template) image object onto the first (reference) image object. In an embodiment, the second (template) image object is non-linearly registered to the first (reference) image object via a deformation field that stretches the template image object to match the reference image object. This registration problem is posed as a functional minimization problem that is non-linear. Variational calculus methods can be employed to solve this functional minimization problem; in essence, minimize a function of a function. The resulting deformation field that is applied to the template image object to match the reference image object mathematically describes the differences between the two image objects. The deformation field can be used as a feature vector for various purposes, such as model identification, defect classification, defect monitoring, process control, etc. For example, values of deformation strain exceeding a certain threshold may be used to identify one or more areas of the structure as having a defect or being prone to defect and quantify such a defect or tendency to defect.

In the context of the first image object and the second image object being visualizations of $\phi$, the first and second datasets may form tensors with each entry of each of the tensors representing a pixel of the respective image object. The datasets, thus, represent the respective image objects at a high resolution and also contain gradient information. The deformation field is then represented by a transformation tensor that transforms the second dataset into the first dataset. Each entry of the transformation tensor forms a pixel deformation vector representing the distance by which a particular pixel in the second image object is to be moved to match a corresponding pixel in the first image object, and a direction in which the particular pixel is to be moved to match the corresponding pixel in the first image object. In an embodiment, the deformation field may be a vector (e.g., in x and y) or a scalar. In an embodiment, the deformation field may be quantified as a deformation strain (e.g., a material strain), which is the derivative of the stretch of the template image object to match the reference image object. The multivariate strain vector can be used as a device feature vector and can allows for classification of defects, as well as identify models, allow for control of the process, etc.

In general, each of the vector entries can be represented as a 2×2 matrix by resolving the x and y components of the deformation vector at each of the pixels. The transformation tensor can be scalarized by obtaining a determinant for each of the 2×2 matrices to obtain a deformation strain matrix. In an embodiment, the first dataset and the second dataset represent the binarized $\phi$ for the reference and the template image objects respectively. The first and second datasets are, therefore, binary matrices.

To obtain the deformation field, the desired result is to find a spatial transformation such that the template image object matches the reference image object subject to a suitable distance measure. In an embodiment, the transformation may be focused on intensity. That is the transformation aims to the intensity pattern between the reference and template image objects based on mathematical or statistical criteria. In an embodiment, like the methods described earlier, the functional to be minimized may include two "forces". An "internal force" which is defined for the displacement field itself and an "external force" which is computed from the image data. The internal force is designed to keep the displacement field smooth during deformation. The external force is defined to obtain the desired registration result. The actual choice of the forces depends on the application under consideration.

So, as an example, an affine linear mapping may be computed such that the pointwise difference, also referred to as the sum of squared differences, between the images is as small as possible.

As another example, a non-linear scheme, sometimes called elastic matching, is applied. So, given two images, a reference R and a template T, the aim of image registration is to find a global and/or local transformation from T onto R in such a way that the transformed template matches the reference. So, let the d-dimensional images be represented by the mappings R, T: $\Omega \to \mathbb{R}$ where $\Omega := ]0, 1[^d$. In other words, for a particular point $x \in \Omega$, the quantity $T(x)$ is the intensity or grey value at the spatial position x. Then the purpose of the registration is to determine a displacement field $u\ \mathbb{R}^d \to \mathbb{R}^d$ such that $T(x-u(x))=R(x)$ or such that $T(x-u(x))$ is similar to $R(x)$, The question then is how to find the desired displacement field $u=(u1, \ldots, u_d)$. To this end, a joint functional may be defined as $J[u]=D[R, T; u]+\alpha S[u]$, where D represents a distance measure (external force) and S determines the smoothness of u (internal force). The parameter a may be used to control the strength of the smoothness of the displacement versus the similarity of the images.

There may be various choices for the functional D. For example, the functional D may be distance measure called sum of squared differences (SSD): $D[R, T; u]:=\frac{1}{2}\int_\Omega (T(x-u(x-R(x))^2 dx$.

Further, there exist various choices for the smoothing term S. For example, smoothing term S may comprise elastic, fluid, demon, diffusion and/or curvature registration. The details of such registrations schemes are described in Fischer and Modersitzki "A unified approach to fast image registration and a new curvature based registration technique," Linear Algebra and its Applications, Volume 380, Pages 107-124 (2004), which is incorporated herein in its entirety by reference.

Further, a variety of different numerical methods may be used for the minimization of the joint functional. For example, a Landwebers iteration, Levenberg-Marquardt like scheme, or multigrid type technique may be used. Further, a variational approach may be used by computing the Gateaux derivative of J[u], which results in Euler-Lagrange equations.

Figure 7A:
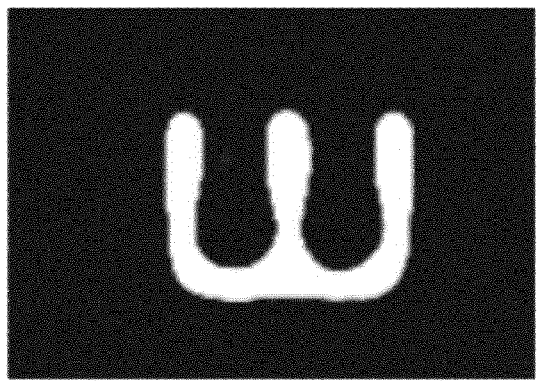
FIGS. 7A-D depict a deformation field corresponding to a transformation of a dataset representing the template image object of FIG. 5A onto the corresponding reference image object.
Figure 7B:
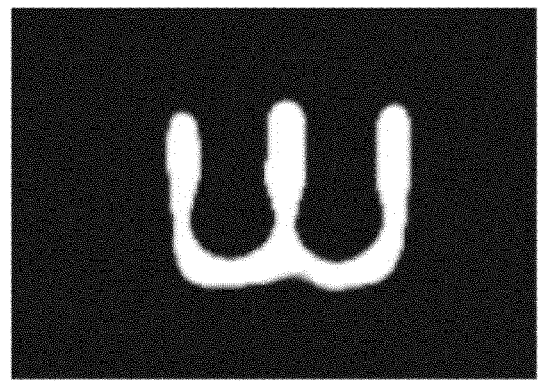
Figure 7C:
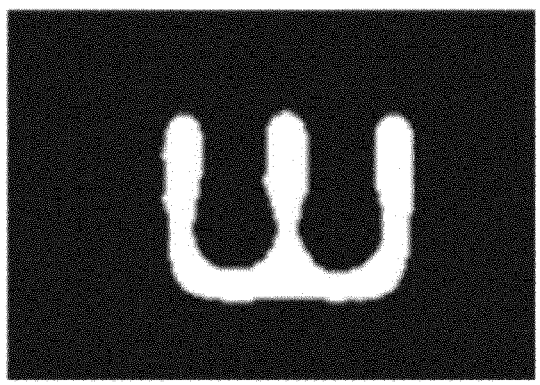
Figure 7D:
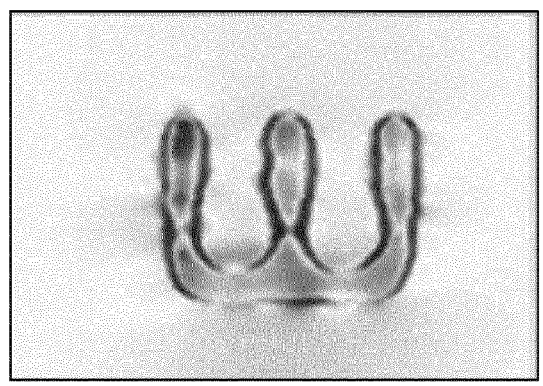

FIGS. 7A-7D depict registration of the second (template) image object to the first (reference) image object via a deformation field that stretches the template image object to match the reference image object. In this example, a binarized representation of a template image object (FIG. 7A) and a reference image object (FIG. 7B) are used. The deformation of the template image object to match the reference image object (i.e., the projection of the template image object onto the reference image object) results in, for example, a binary representation of the deformed template object (FIG. 7C). The deformation field, quantified as a deformation strain (FIG. 7D), is shown that transforms the template image object to project onto the reference image object. As can be seen in the deformation strain plot, the strain is higher in regions where the reference and template image objects don't match.

Figure 8A:
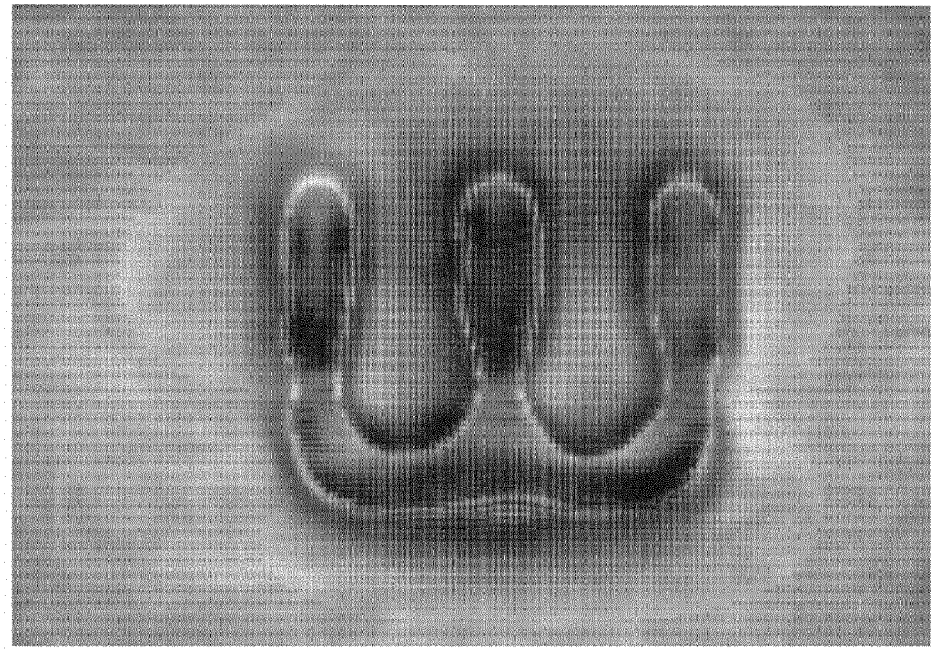
FIGS. 8A and 8B depict a binarized visualization of transformation of a template image object to project onto a reference image object, and a deformation strain associated with the transformation.
Figure 8B:
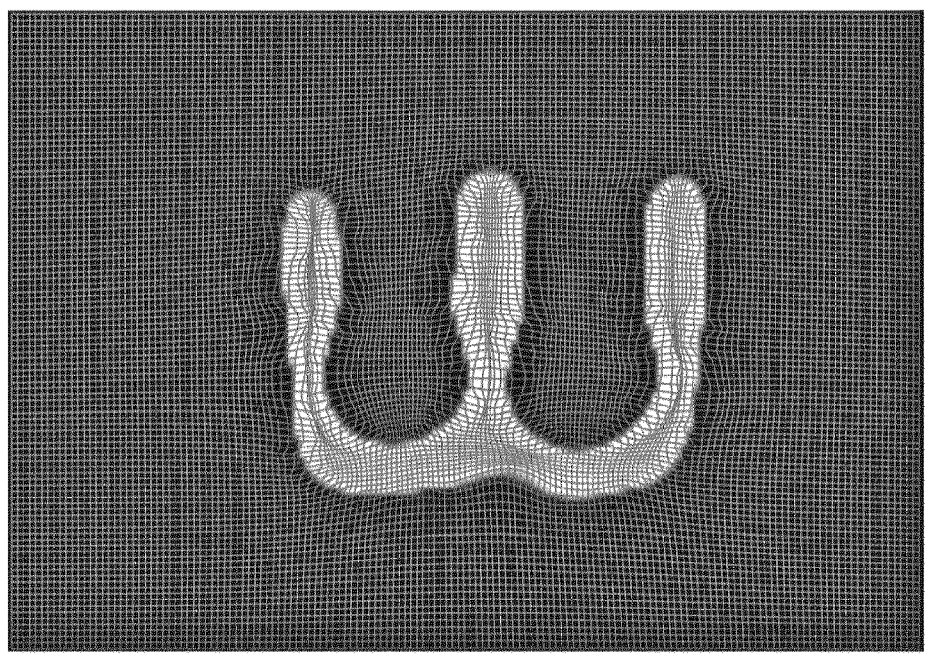

FIGS. 8A and 8B depict two further examples of the deformation field. In a first example, FIG. 8A, there is depicted a deformation field corresponding to the transformation of the dataset representing the template image object (FIG. 7B) projected onto the corresponding reference image object (FIG. 7A). In a second example, FIG. 8B, there is also depicted a deformation field corresponding to the transformation of the dataset representing the template image object (FIG. 7B) projected onto the corresponding reference image object (FIG. 7A). The difference of this second example from the first example is that the template image object (FIG. 7B) is shown in relation to the deformation field rather than the reference image object (FIG. 7A) and the deformation is shown in grid format.

Thus, this method allows derivation of a rich multivariate signal/representation that quantifies local differences in a complicated device structure as imaged by the SEM. This signal/representation enables a description of how a device structure changes as a function of one or more influences, such as focus, dose, etc. This signal/representation can be used for model identification, defect classification, defect estimation, process monitoring, and process control.

In some embodiments, a determinant of the deformation strain matrix may be obtained to provide a measure of deformation of the second image object needed to project onto the first image object. In other words, a determinant of the deformation strain matrix provides a cost-function for the deformation. Thus, a template image object may be classified as acceptable or unacceptable based on this cost-function to determine a yield of a process of manufacture. For example, the classification may be based on a threshold value of the cost-function. If the determinant of the deformation strain matrix is higher than the threshold, the template image object is defective and unacceptable. If the determinant of the deformation strain matrix is lower than the threshold, the template image object is acceptable.

Figure 9:
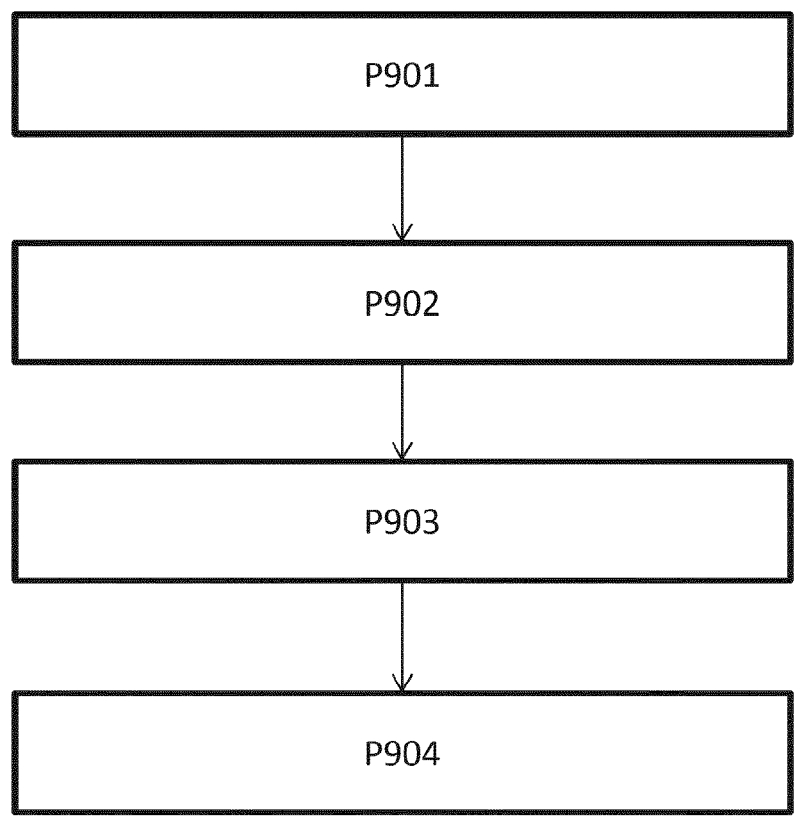
FIG. 9 depicts a process of monitoring and/or controlling one or more process parameters based on analysis of images of formed structures.

In an embodiment, as depicted in FIG. 9, a method of monitoring and/or controlling a process parameter based on analysis of image objects representing a structure of a device is described. The method may include obtaining, at P901, a reference image object corresponding to a structure obtained at a nominal condition of a parameter, obtaining, at P902, a template dataset by imaging the structure at a non-nominal condition of the parameter. The method further includes, at P903, obtaining a deformation field generated by transforming the template dataset to project a template image object onto the reference image object as described herein. The deformation field is then used at P904 to obtain a dependence relationship for the parameter by iteratively varying the parameter to obtain a plurality of template datasets corresponding to a plurality of non-nominal conditions. The dependence relationship is generated by modeling a change in the deformation field for each of the plurality of non-nominal conditions.

For example, in an embodiment, one or more parameters (e.g., focus, exposure dose, etc.) may be iteratively varied and a deformation field computed for each of the values of the one or more parameters. A vector Y of each of the deformations may be created and then vector Y can be correlated to the changes in the one or more parameters. Thus, the effect of the one or more parameters on the deformation field can be modeled. Similarly, by using, for example, regression analysis, the change in the vector Y as a function of the one or more parameters can be modeled. Such models may be useful in predicting how the deformation field, and thereby, how the object itself will change when a particular change is effected in the value of a parameter.

In an embodiment, such predictive analysis may be used in determining if a defect in an object is the result of variation in a parameter, or some other factor such as, for example, an anomaly in the imaging apparatus. For example, as noted above, if a strain exceeds a certain threshold, then that may indicate a defect or a tendency of a defect to occur and so the change in the parameter may be correlated to the strain to identify whether a particular change in the parameter will cause, or have a tendency to cause, a defect.

Further, the predictive analysis may be supplemented by other data, such as electrical test results, to correlate defects to strain so as to identify an appropriate threshold for strain that identifies the occurrence of a defect or the tendency of a defect to occur.

The predictive analysis may also be used against measured structures of, e.g., production lithographically created structures. For example, the predictive analysis may be used to predict certain parameter values (e.g., particular widths) of certain structures and then one or more production lithographically created versions of the structures may be measured using, for example, a scatterometer for comparison with the prediction. If the measurement and the prediction sufficiently match then the structure may be deemed "good". Otherwise, the structure may be reprocessed or scrapped. Further, the data from the comparison may be fed back into the predictive analysis (as data to establish correlations) and may be used to effect a change in the process (e.g., an insufficient match between the measurement and the prediction (that, for example, occurs a certain number of times) may be an indicator of a need for a change in the process).

In association with an imaging apparatus such as a SEM, an embodiment may include a computer program containing one or more sequences of machine-readable instructions describing a method of detecting and representing an imaged structure, registering a template image object representing the imaged structure against a reference image object, and/or predicting a change in a structure based on variation in a parameter during a lithographic process. This computer program may be included, for example, with or within the imaging apparatus of FIG. 3 and/or with or within the control unit LACU of FIG. 2. There may also be provided a data storage medium (e.g., semiconductor memory, magnetic or optical disk) having such a computer program stored therein. Where an existing apparatus, for example of the type shown in FIGS. 1-3, is already in production and/or in use, an embodiment can be implemented by the provision of updated computer program products for causing a processor of the apparatus to perform a method as described herein.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further, although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The invention may further be described using the following clauses:

1. A method comprising:
   obtaining an image of a lithographically created structure; and
   applying, using a computer processor, a level set method to an object, representing the structure, of the image to create a mathematical representation of the structure.
2. The method of clause 1, wherein applying the level set method comprises minimizing an energy functional via variational calculus.
3. The method of clause 2, wherein the applying the level set method comprises detecting the object boundary by solving Euler-Lagrange equations for the functional.
4. The method of clause 1, further comprising binarizing the mathematical representation to obtain a dataset representing the object.
5. The method of clause 4, wherein binarizing the mathematical representation comprises setting a value of the mathematical representation to a certain value for all spaces where the mathematical description has a value greater than zero, and setting the value of the mathematical representation to another value for all spaces where the mathematical description has a value less than zero.

6. The method of clause 5, further comprising using the mathematical representation to change a parameter of a process to create the structure.

7. A method comprising:
defining a curve enclosing an object, representing a lithographically created structure, of an image;
evolving, using a computer processor, the curve subject to constraints of the object;
terminating evolution of the curve when an area enclosed by the curve reaches the boundary of the object; and
obtaining, using the computer processor, a numerical function upon termination of the evolution of the curve.

8. The method of clause 7, further comprising binarizing the numerical function to obtain a dataset representing the object.

9. The method of clause 8, wherein binarizing the numerical function comprises setting a value of the numerical function to a certain value for all spaces where the numerical function has a value greater than zero, and setting the value of the numerical function to another value for all spaces where the numerical function has a value less than zero.

10. The method of any of clauses 7 to 9, wherein evolving the curve comprises applying a level set method comprising minimizing an energy functional via variational calculus 11. The method of clause 10, wherein the applying the level set method comprises detecting the object boundary by solving Euler-Lagrange equations for the functional.

12. The method of any of clauses 7 to 11, further comprising using the numerical function to change a parameter of a process to create the structure and/or to evaluate an image comprising a plurality of structures to identify one or more instances of the particular structure in the image.

13. The method of any of clauses 1 to 12, wherein the structure comprises a circuit feature of an integrated circuit.

14. The method of any of clauses 1 to 13, wherein the image is a scanning electron microscope image.

15. A method of manufacturing devices wherein a device pattern is applied to a series of substrates using a lithographic process, the method including evaluating a lithographically created structure imaged using the lithographic process using the method of any of clauses 1 to 14 and controlling the lithographic process for one or more of the substrates in accordance with the result of the method.

16. The method of clause 15, wherein the lithographically created structure is imaged on at least one of the substrates and controlling the lithographic process for later substrates in accordance with the result of the method.

17. A non-transitory computer program product comprising machine-readable instructions configured to cause a processor to cause performance of the method of any of clauses 1 to 16.

18. A system comprising:
a scanning electron microscope configured to provide an image of a lithographically created structure; and
an image analysis engine comprising the non-transitory computer program product of clause 17.

19. The system of clause 18, further comprising a lithographic apparatus comprising a support structure configured to hold a patterning device to modulate a radiation beam and a projection optical system arranged to project the modulated onto a radiation-sensitive substrate.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. A method comprising:
evolving, by a hardware computer processor system, a curve enclosing an object subject to constraints of the object, the object, representing a lithographically created structure, of an image from a SEM or optical inspection apparatus;
terminating evolution of the curve when an area enclosed by the curve reaches to, or near, the boundary of the object; and
obtaining, by the hardware computer processor system, a numerical function upon termination of the evolution of the curve, wherein the numerical function is configured for a classification of a defect, for an estimation of a defect, for a monitoring of a process, and/or for a controlling of a process.

2. The method of claim 1, further comprising binarizing the numerical function to obtain a dataset representing the object.

3. The method of claim 2, wherein binarizing the numerical function comprises setting a value of the numerical function to a certain value for all spaces where the numerical function has a value greater than zero, and setting the value of the numerical function to another value for all spaces where the numerical function has a value less than zero.

4. The method of claim 1, wherein evolving the curve comprises applying a level set method comprising minimizing an energy functional via variational calculus.

5. The method of claim 1, further comprising using the numerical function to change a parameter of a process to create the structure and/or to evaluate an image comprising a plurality of structures to identify one or more instances of the particular structure in the image.

6. The method of claim 1, wherein the structure comprises a circuit feature of an integrated circuit and/or the image is a scanning electron microscope image.

7. A method of manufacturing devices wherein a device pattern is applied to a series of substrates using a lithographic process, the method including evaluating, using the method of claim 1, a lithographically created structure imaged using the lithographic process and controlling the lithographic process for one or more of the substrates in accordance with the result of the method.

8. The method of claim 7, wherein the lithographically created structure is imaged on at least one of the substrates and controlling the lithographic process for later substrates in accordance with the result of the method.

9. A non-transitory computer program product comprising machine-readable instructions therein, the instructions, upon execution by a computer processor system, configured to cause the computer processor system to at least:
 evolve a curve enclosing an object subject to constraints of the object, the object, representing a lithographically created structure, of an image from a SEM or optical inspection apparatus;
 terminate evolution of the curve when an area enclosed by the curve reaches to, or near, the boundary of the object; and
 obtain a numerical function upon termination of the evolution of the curve, wherein the numerical function is configured for a classification of a defect, for an estimation of a defect, for a monitoring of a process, and/or for a controlling of a process.

10. The computer program product of claim 9, wherein the instructions are further configured to cause the computer processor system to binarize the numerical function to obtain a dataset representing the object.

11. The computer program product of claim 10, wherein the instructions configured to cause the computer processor system to binarize the numerical function are further configured to cause the computer processor system to set a value of the numerical function to a certain value for all spaces where the numerical function has a value greater than zero, and set the value of the numerical function to another value for all spaces where the numerical function has a value less than zero.

12. The computer program product of claim 9, wherein the instructions configured to cause the computer processor system to evolve the curve are further configured to cause the computer processor system to apply a level set method comprising minimization of an energy functional via variational calculus.

13. The computer program product of claim 9, wherein the instructions are further configured to cause the computer processor system to use the numerical function to change a parameter of a process to create the structure and/or to evaluate an image comprising a plurality of structures to identify one or more instances of the particular structure in the image.

14. The computer program product of claim 9, wherein the structure comprises a circuit feature of an integrated circuit and/or the image is a scanning electron microscope image.

15. A system comprising:
 an inspection apparatus configured to provide an image of a lithographically created structure; and
 an image analysis engine comprising the non-transitory computer program product of claim 9.

16. The system of claim 15, wherein the inspection apparatus is an electron beam measurement apparatus.

17. A non-transitory computer program product comprising machine-readable instructions therein, the instructions, upon execution by a computer processor system, configured to cause the computer processor system to at least:
 apply a level set method to an object, representing a lithographically created structure, of an image from a SEM or optical inspection apparatus such that a curve is evolved relative to the object subject to constraints of the object; and
 upon termination of evolution of the curve when an area enclosed by the curve reaches to, or near, the boundary of the object, create a mathematical representation of the structure, wherein the mathematical representation is configured for a classification of a defect, for an estimation of the defect, for a monitoring of a process, and/or for a controlling of a process.

18. The computer program product of claim 17, wherein the application of the level set method comprises minimization of an energy functional via variational calculus.

19. The computer program product of claim 17, wherein the instructions are further configured to cause the computer processor system to binarize the mathematical representation to obtain a dataset representing the object.

20. The computer program product of claim 17, wherein the instructions are further configured to cause the computer processor system to use the mathematical representation to change a parameter of a process to create the structure.

21. A non-transitory computer program product comprising machine-readable instructions therein, the instructions, upon execution by a computer processor system, configured to cause the computer processor system to at least:
 process a noisy SEM or optical inspection image containing an object representing a lithographically created structure, by:
  evolution of a curve enclosing the object subject to constraints of the object, or
  application of a level set method to the object such that a curve is evolved relative to the object subject to constraints of the object; and
 obtain a high resolution mathematical representation or numerical function corresponding to the structure upon termination of evolution of the curve, wherein the mathematical representation or numerical function is configured for a classification of a defect, for an estimation of a defect, for a monitoring of a process, and/or for a controlling of a process.

22. The computer program product of claim 21, wherein the instructions configured to process the noisy SEM or optical inspection image are configured to cause the computer system to evolve a curve enclosing the object subject to constraints of the object.

23. The computer program product of claim 21, wherein the instructions configured to process the noisy SEM or optical inspection image are configured to cause the computer system to apply a level set method to the object such that a curve is evolved relative to the object subject to constraints of the object.

* * * * *